(12) United States Patent
Acena et al.

(10) Patent No.: US 7,852,089 B2
(45) Date of Patent: Dec. 14, 2010

(54) GROUND-FAULT DETECTION SYSTEM FOR VEHICLES WITH A HIGH-VOLTAGE POWER NET

(75) Inventors: Miguel Angel Acena, Valls (ES); Jordi Escoda, Valls (ES)

(73) Assignee: Lear Corporation, Southfield, MI (US)

( * ) Notice: Subject to any disclaimer, the term of this patent is extended or adjusted under 35 U.S.C. 154(b) by 299 days.

(21) Appl. No.: 12/117,145

(22) Filed: May 8, 2008

(65) Prior Publication Data

US 2009/0278547 A1    Nov. 12, 2009

(51) Int. Cl.
*G01R 27/08* (2006.01)
(52) U.S. Cl. .................. 324/503; 324/557; 324/522
(58) Field of Classification Search .................. 324/503, 324/509, 524, 525, 504, 522, 557
See application file for complete search history.

(56) References Cited

U.S. PATENT DOCUMENTS

| 7,005,860 | B2* | 2/2006 | Yamamoto et al. | 324/527 |
| 7,554,333 | B2* | 6/2009 | Morita | 324/509 |
| 7,560,935 | B2* | 7/2009 | Morimoto | 324/525 |

* cited by examiner

*Primary Examiner*—Vincent Q Nguyen
(74) *Attorney, Agent, or Firm*—Brooks Kushman P.C.

(57) ABSTRACT

A ground-fault detection system and method for detecting loss of electrical isolation in a vehicle or other system that uses a high voltage (HV) power net. The loss of electrical isolation may be determined by charging HV capacitors, then connecting them at different times between the power-net HV wires and the ground (or vehicle chassis), and measuring their remaining charge after a fixed period. The HV system can be regarded as properly isolated from ground or not as a function of the energy lost by the aforementioned capacitors during their connection to the HV power net.

20 Claims, 5 Drawing Sheets

GROUND FAULT DETECTOR | VEHICLE POWER-NET

GROUND-FAULT DETECTION SYSTEM FOR VEHICLES WITH A HIGH-VOLTAGE POWER NET

BACKGROUND OF THE INVENTION

Electric, hybrid-electric, and other vehicles that rely totally or partially on electric power may include a high voltage (HV) battery. The HV battery may be connected to an HV electrical distribution system that delivers/takes energy to/from any number of HV vehicle systems, such as but not limited to a traction inverter, a charger, a DC-DC converter and other HV loads. The HV distribution system may include wires or other infrastructure to transfer the HV energy between the HV systems. The wires may be used to characterize a HV power network having a high voltage positive (HV_P) wire and a high voltage negative (HV_N) wire. Since neither of these wires are connected to the vehicle ground (i.e. vehicle chassis), the HV power network is considered to have a floating ground.

A number of low voltage (LV) systems may be connected to the vehicle ground, such as but not limited to vehicle lights, infotainment devices, air-conditioning system, seat motors, etc. Similar to the HV power network, the LV system may rely on a LV power network to facilitate distributing the LV energy. The electrical isolation of the HV power network from the LV power network can be critical in maintaining the proper operation of both networks and the systems that rely on them.

DETAILED DESCRIPTION OF THE PREFERRED EMBODIMENT(S)

Figure 1:
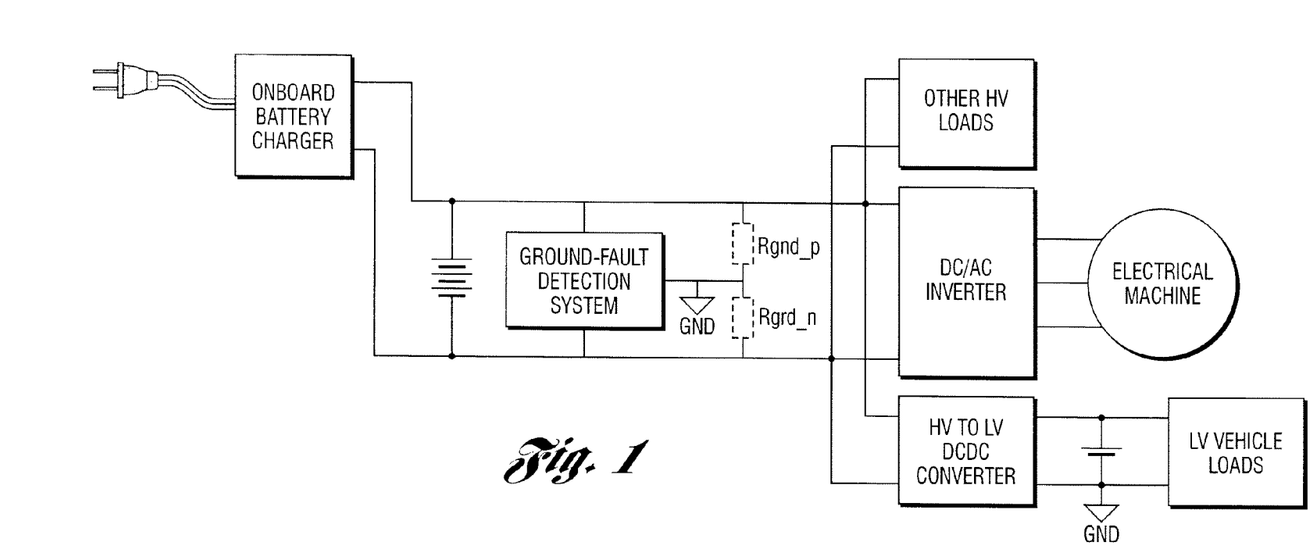
FIG. 1 illustrates a HV vehicle system in accordance with one non-limiting aspect of the present invention.

FIG. 1 illustrates a HV vehicle system in accordance with one non-limiting aspect of the present invention. The system may include a HV battery that delivers/receives HV energy to/from a HV power network having a high voltage positive (HV_P) wire and high voltage negative (HV_N) wire. The HV power network may be electrically isolated from a low voltage (LV) power network that provides low voltage energy to one or more LV loads. Maintenance of the electrical isolation of the HV network from the LV network can be critical in maintaining the proper operation of both nets and the systems that rely on them. One non-limiting aspect of the present invention contemplates testing this electrical isolation.

The system for exemplary purposes and without intending to limit the scope and contemplation of the present invention is shown to include a number of features that may be used to support a vehicle based arrangement that relies totally or partially on HV energy. These features may include but are not limited to a battery charger, HV battery, ground-fault detection system, HV loads, HV DC/AC inverter, HV electric machine (motor), HV to LV DC/DC converter, LV battery, vehicle ground, and LV loads. The battery charger may be configured to charge the HV battery with energy provided from a wall-plug or other external power source. The DC/AC inverter may be used to convert HV DC energy supplied from the HV battery to AC energy that can be used to drive the electric machine, which may also be configured to translate mechanical rotation of the electric machine in to DC energy that can be used to charge the HV battery. The HV to LV DC/DC converter may be used to convert the HV energy to LV energy that can be used to operate the LV loads. The ground-fault detection system may be used in combination with these and other features to facilitating testing electrical isolation of the HV system in accordance with one non-limiting aspect of the present invention.

Figure 2:
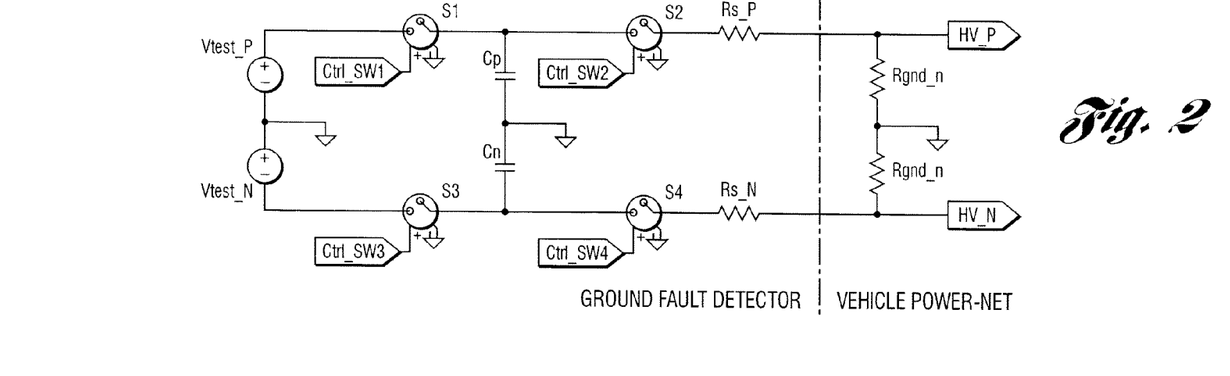
FIG. 2 schematically illustrates a testing arrangement in accordance with one non-limiting aspect of the present invention.

FIG. 2 schematically illustrates a testing arrangement that can be used to test the electrical isolation of the HV system in accordance with one non-limiting aspect of the present invention. The testing arrangement may be used to facilitating testing the electrical isolation of the HV and LV networks based on capacitor discharge (Cp, Cn) to each of the wires in the HV system. As shown in FIG. 1, phantom resistors (Rgnd_P and Rgnd_N) are illustrated to represent the equivalent electrical resistance to vehicle ground of the HV network wires and other elements of the HV system.

Rgnd_P and Rgnd_N can be physically measured between the HV wires and the vehicle chassis. Their values reflect the degree of isolation between the HV power net and ground. With them, a charged capacitor that is connected to any of these resistors will experience a certain discharge after a fixed time depending on the value of the aforementioned resistors (a small resistance will produce a large capacitor discharge and a large resistance will produce a small capacitor discharge). Importantly, FIG. 2 excludes the HV battery from the HV power network. This is done for exemplary purposes and to demonstrate one non-limiting aspect of the present invention with respect to testing the electrical isolation while the vehicle is off or the HV battery is otherwise removed from the HV network.

If the HV system is improperly isolated from vehicle ground or the LV system, a breakdown has occurred somewhere in the system and the capacitors Cp and Cn will discharge greater amounts of energy into the HV system, once they have been previously charged and connected to the HV power net as shown in FIG. 2. The degree of isolation decreases with the increase in capacitor discharge. When the HV is properly isolated from vehicle ground and/or the LV system, the equivalent electrical resistance is greater than some nominal value or limit, and when the electrical isolation becomes improper, the equivalent electrical resistance to ground becomes lower than this limit. The electrical isolation becomes worse as the equivalent electrical resistance to ground lowers.

FIG. 2 schematically illustrates discharging Cp and Cn to the HV_P wire and the HV_N wire through the equivalent positive (Rgnd_P) and negative (Rgnd_N) resistances. The amount of capacitor discharge reflects the equivalent resistance between each HV wire and ground. If the discharge is low (shallow), the equivalent resistance is high and the isolation can be characterized as proper. If the discharge is above some nominal level, the equivalent resistance is lower and the isolation can be characterized as improper. The ground-fault detection circuit may further include a pair of HV power source that are respectively configured to charge the capacitor Cp discharging to the HV_P wire with a test voltage (Vtest_P) and the capacitor Cn discharging to the HV_N wire with a test voltage (Vtest_N). Switches (SW1, SW2, SW3, and SW4) may be controlled by a controller (not shown) or other element to facilitate charging and discharging the Cp and Cn and executing the other operations contemplated by the present invention.

From FIG. 2, Vtest_P and Vtest_N are two DC voltage sources that are separate from the HV vehicle battery, are used to charge Cp and Cn thru S1 and S3 respectively. S2 and S4 are used to connect each of Cp and Cn to the HV vehicle power lines (HV_P and HV_N) during a fixed time. Rs_P and Rs_N resistors can be used to limit the discharge current from the capacitors in case of a very low value, short-circuit, or poor isolation of Rgnd_p or Rgnd_n.

Each of the branches (one corresponding to HV_P and the other to HV_N) are operated at different times so that they do not overlap each other. The operation of the whole system can be described by observing the timing of the four switches (S1, S2, S3 and S4). The activation of the switches is shown in FIGS. 3a-3d.

Figure 3A:
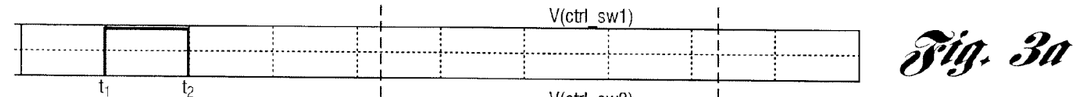
FIGS. 3*a*-3*d* illustrate switch timing in accordance with one non-limiting aspect of the present invention.
Figure 3B:
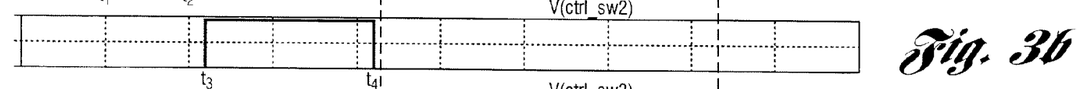

Following this timing, and starting with the four switches in the open state, at time $t_1$ S1 is closed to allow Cp to be charged up to Vtest_P (FIG. 3a). Before $t_2$, the capacitor is completely charged (Vcp=Vtest_P) and then S1 opens. At time $t_3$, S2 is closed and kept in that state up to $t_4$. During this interval (T=$t_4$−$t_3$) the capacitor Cp is discharged thru a resistor that equals to the sum of Rs_P and Rgnd_p (FIG. 3b). After this discharging process, at time $t_{cp}$, the resulting voltage across the capacitor Cp (Vcp) can be approximated to:

$$V_{Cp}(t = t_{cp}) \approx V_{test\_P} \cdot e^{-T/(C_P \cdot (R_{s\_p} + R_{gnd\_p}))} \quad \text{Eq. 1}$$

And this voltage, if measured at time $t_{cp}$, reflects the level of isolation that exists between the HV_P line and GND (i.e. the magnitude of Rgnd_p) since it is related to Rgnd_p by Eq. 1. A value of Vcp at t=tcp that is close to Vtest_p means a shallow discharge of Cp during T as a consequence of a large value of Rgnd_p. On the contrary, a deep discharge of Cp during T implies a ground fault due to a low value of Rgnd_p.

Figure 3C:
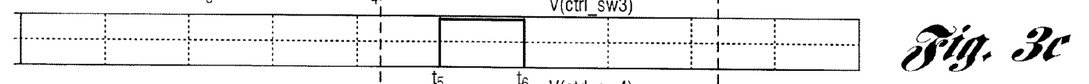
Figure 3D:
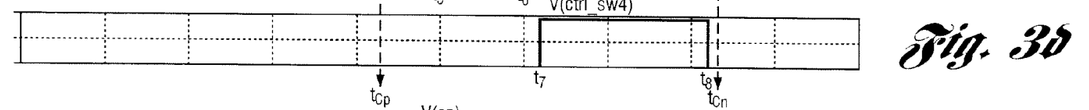

To evaluate Rgnd_n at the negative side of the HV power net (HV_N), a similar process can be followed using the S3 and S4 switches. S3 is closed at time $t_5$ to allow Cn to be charged up to −Vtest_N (FIG. 3c). Before $t_6$, the capacitor is completely charged (Vcn=−Vtest_N) and then S3 opens. At time $t_7$, S4 is closed and kept in that state up to $t_8$. During this interval (T=$t_8$−$t_7$) the capacitor Cn is discharged thru a resistor that equals to the sum of Rs_N and Rgnd_n (FIG. 3d). After this discharging process, at time $t_{cn}$, the resulting voltage across the capacitor Cn (Vcn) can be approximated to:

$$V_{Cn}(t = t_{cn}) \approx -V_{test\_N} \cdot e^{-T/(C_n \cdot (R_{s\_n} + R_{gnd\_N}))} \quad \text{Eq. 2}$$

This voltage Vcn(t=$t_{cn}$), gives information about the level of isolation that exists between the HV_N line and GND (i.e. the magnitude of Rgnd_n) as described by Eq. 2. A value of Vcn at t=$t_{cn}$ close to −Vtest_n means a shallow discharge of Cn during T as a consequence of a large value of Rgnd_n. On the contrary, a deep discharge of Cn during T implies a ground fault thru a low value of Rgnd_n.

Figure 4A:
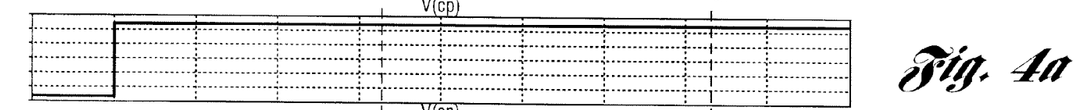
FIGS. 4*a*-4*d* illustrate capacitive discharge in accordance with one non-limiting aspect of the present invention.
Figure 4B:
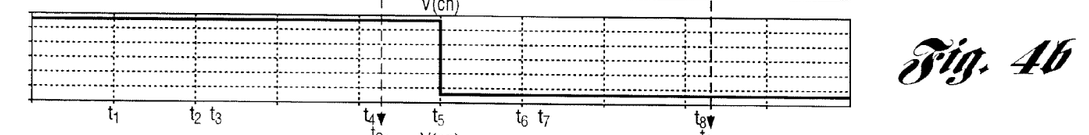
Figure 4C:
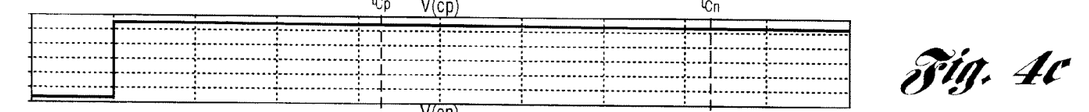

The operation of the present ground-fault detector can also be described by observing the voltage waveforms across Cp and Cn as depicted in FIGS. 4a-4d. FIGS. 4a, 4b, and 4c show the capacitors voltages when no ground fault is present (i.e. Rgnd_p and Rgnd_n are both large). At times $t_{cp}$ and $t_{cn}$, the voltages of both capacitors are almost the same than at time $t_3$ and $t_7$ respectively, meaning the capacitors have not been discharged by the system resistors to ground.

Figure 4D:
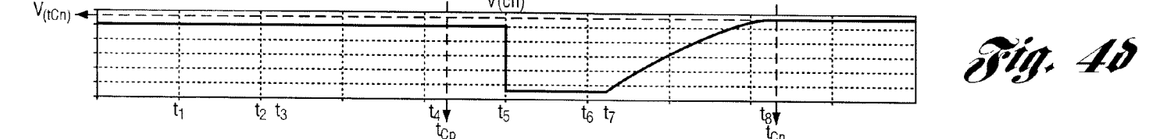

In FIG. 4d a ground fault can be detected. When evaluating the voltage across Cn at time $t_{cn}$, it has changed significantly during the interval T=$t_8$−$t_7$ due to a low value of Rgnd_n.

The above described operation of the ground-fault detector is based upon the absence of the HV battery from the HV electrical system, i.e., a stopped car at the garage. When the traction HV battery is present (e.g. when the car runs), the system under test changes and hast to be characterized and measured in a different way in order to check if a ground fault exists.

Figure 5:
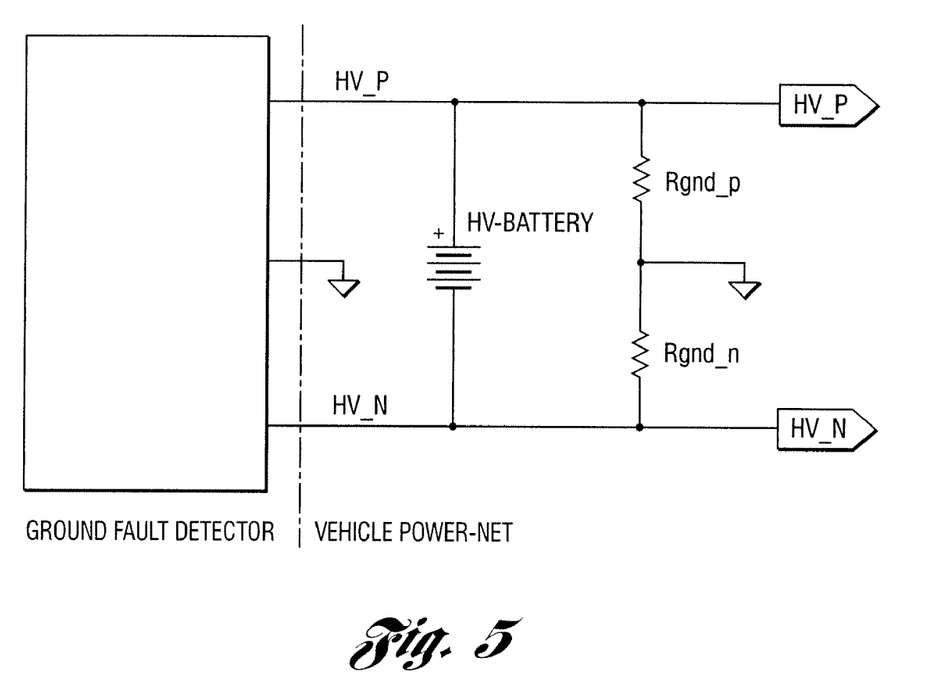
FIG. 5 schematically illustrates the testing arrangement when the HV battery is present in accordance with one non-limiting aspect of the present invention.

FIG. 5 schematically illustrates the testing arrangement when the HV battery is present in accordance with one non-limiting aspect of the present invention.

Figure 6A:
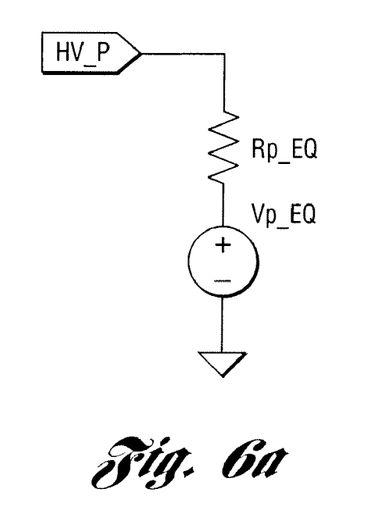
FIGS. 6*a*-6*b* illustrate equivalent circuits seen by a ground-fault detector from HV_P and HV_N when a traction battery is present in accordance with one non-limiting aspect of the present invention.
Figure 6B:
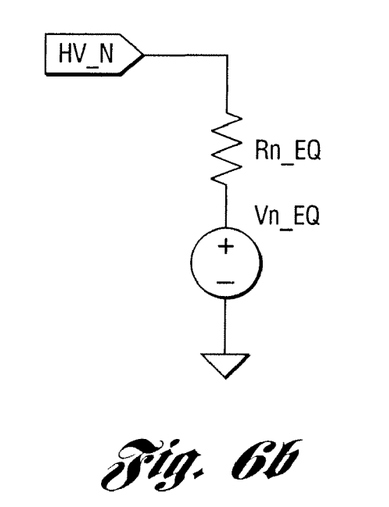

The aforementioned HV battery can be represented as an ideal voltage source plus a low equivalent series resistor ($R_{s\_batt}$). The circuits that are seen from each side of the ground-fault detector (HV_P and HV_N) can be drawn as in FIGS. 6a-6b. FIG. 6a is the equivalent circuit to be probed by the ground-fault detector from the HV_P, and FIG. 6b is the one to be probed from HV_N. Both equivalences arise from applying the Thevenin's theorem to the vehicle power-net in FIG. 5 at HV_P and HV_N respect to GND.

Then, it results that:

$$R_{P\_EQ} = \frac{(R_{s\_batt} + R_{gnd\_n}) \cdot R_{gnd\_p}}{R_{s\_batt} + R_{gnd\_n} + R_{gnd\_p}} \approx \frac{R_{gnd\_n} \cdot R_{gnd\_p}}{R_{gnd\_n} + R_{gnd\_p}} \quad \text{Eq. 3}$$

$$V_{p\_EQ} = V_{HV\_batt} \frac{R_{gnd\_p}}{R_{s\_batt} + R_{gnd\_n} + R_{gnd\_p}} \quad \text{Eq. 4}$$

$$\approx V_{HV\_batt} \frac{R_{gnd\_p}}{R_{gnd\_n} + R_{gnd\_p}}$$

$$R_{n\_EQ} = \frac{(R_{s\_batt} + R_{gnd\_p}) \cdot R_{gnd\_n}}{R_{s\_batt} + R_{gnd\_n} + R_{gnd\_p}} \approx \frac{R_{gnd\_p} \cdot R_{gnd\_n}}{R_{gnd\_n} + R_{gnd\_p}} \quad \text{Eq. 5}$$

$$V_{n\_EQ} = -V_{HV\_batt} \frac{R_{gnd\_n}}{R_{s\_batt} + R_{gnd\_n} + R_{gnd\_p}} \quad \text{Eq. 6}$$

$$\approx -V_{HV\_batt} \frac{R_{gnd\_n}}{R_{gnd\_n} + R_{gnd\_p}}$$

From Eq. 3 and 5 it can be seen that both equivalent resistances are approximated to the same value (i.e. the parallel of Rgnd_p and Rgnd_n), which is reasonable since the series resistor of the battery can be neglected (it is usually more than five orders of magnitude smaller than the leakage resistances Rgnd_p and Rgnd_n, and also up to 1000 times smaller than these resistances in the case of a large ground fault). With this:

$$R_{gnd\_EQ} = R_{p\_EQ} = R_{n\_EQ} = \frac{R_{gnd\_p} \cdot R_{gnd\_n}}{R_{gnd\_n} + R_{gnd\_p}} \quad \text{Eq. 7}$$

And this is the resistance that the ground fault detector evaluates when the HV battery is present in the vehicle in order to detect a possible failure ($R_{gnd\_EQ} < R_{limit}$).

Figure 7:
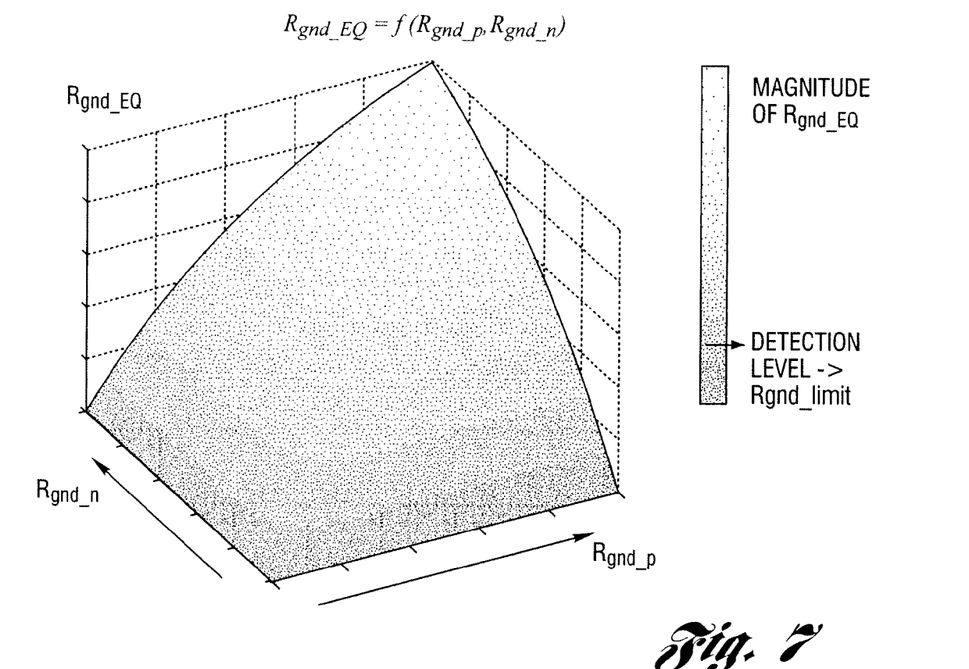
FIG. 7 graphically illustrates the equivalent resistance in accordance with one non-limiting aspect of the present invention.

FIG. 7 plots Rgnd_EQ as a function of Rgnd_n and Rgnd_p following Eq. 7. There, a detection level (warning or failure) can be set for Rgnd_EQ upon which the system is regarded as OK (i.e. no ground fault exists).

If the ground-fault detector is used to evaluate the isolation levels of the equivalent circuits of the networks HV_P and HV_N given by FIG. 6a and FIG. 6b (i.e. the HV lines when the vehicle runs), then the discharges of the ground-fault-detector's capacitors may be described by the following equations:

$$V_{Cp}(t=t_{cp}) \approx (V_{test\_P} - V_{p\_EQ}) \cdot e^{-T/(C_p \cdot (R_{s\_p} + R_{gnd\_EQ}))} + V_{p\_EQ} \quad \text{Eq. 8}$$

$$V_{Cn}(t=t_{cn}) \approx (V_{test\_N} - V_{n\_EQ}) \cdot e^{-T/(C_n \cdot (R_{s\_n} + R_{gnd\_EQ}))} + V_{n\_EQ} \quad \text{Eq. 9}$$

With $T=t_4-t_3=t_8-t_7$ as described above with respect to FIGS. 3a-3b, Vcp and Vcn at times $t_{cn}$ and $t_{cp}$ respectively can be acquired by a microcontroller or a separated analog-to-digital converter circuit (not shown) and kept in a memory as numeric values and the following function relates its output to the $R_{gnd\_EQ}$ under measurement:

$$V_{GFDet}(R_{gnd\_EQ}) = V_{Cp}(t=t_{cp}) - V_{Cn}(t=t_{cn}) = \quad \text{Eq. 10}$$
$$= \left[ \begin{array}{c} (V_{test\_P} - V_{p\_EQ}) \cdot \\ e^{-T/(C_p \cdot (R_{s\_p} + R_{gnd\_EQ}))} + V_{p\_EQ} \end{array} \right] - \left[ \begin{array}{c} (V_{test\_N} - V_{n\_EQ}) \cdot \\ e^{-T/(C_n \cdot (R_{s\_n} + R_{gnd\_EQ}))} + V_{n\_EQ} \end{array} \right]$$

Figure 8:
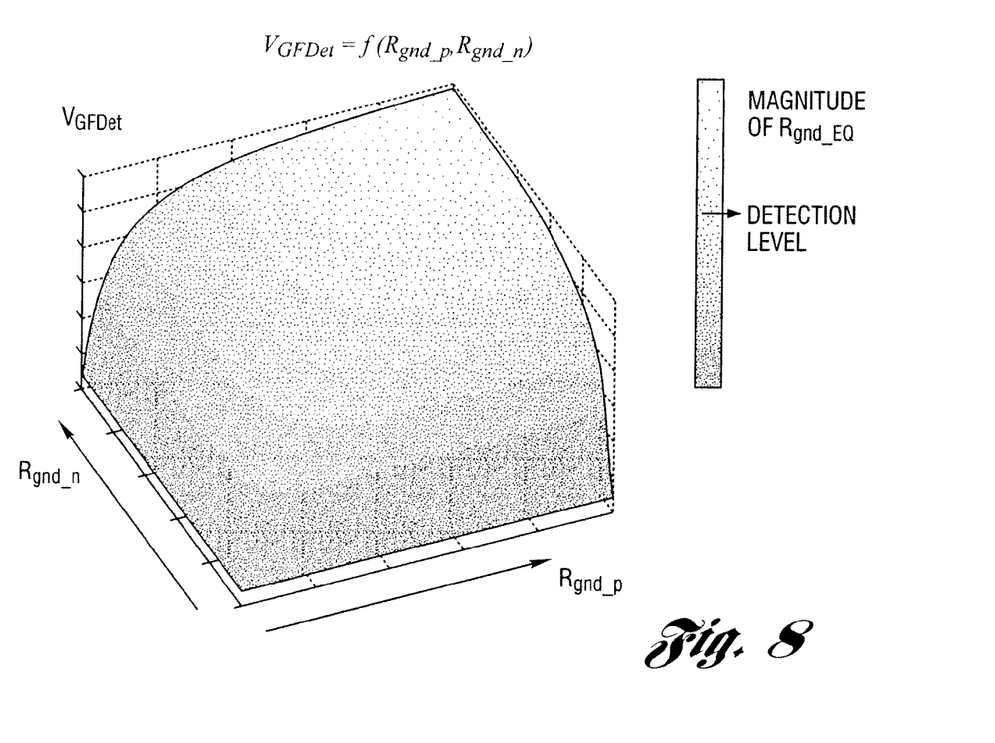
FIG. 8 graphically illustrates a voltage of the ground-fault detection system as a function of the equivalent resistances in accordance with one non-limiting aspect of the present invention.

For illustration purposes, FIG. 8 plots $V_{GFDet} = f(R_{gnd\_p}, R_{gnd\_n})$ assuming Eq. 7, $R_{s\_p} = R_{s\_n}$, and $C_p = C_n$. Additionally, $V_{test\_P}$ may equal $V_{test\_N}$ and both must be greater than $V_{HV\_batt}$ in order to guarantee the charge of Cp and Cn up to a voltage greater than the Vhv_batt. With this, the capacitors will always have charge available for the HV power net for any value of the equivalent ground resistors. This will also prevent the capacitors from drawing energy from the HV battery when connected to the vehicle electrical system.

Regarding the practical realization of the presented ground-fault detector, it must be noted that there could be many alternative solutions or variants. Any system (hardware+software) operating upon the basis of the present invention is contemplated.

Figure 9:
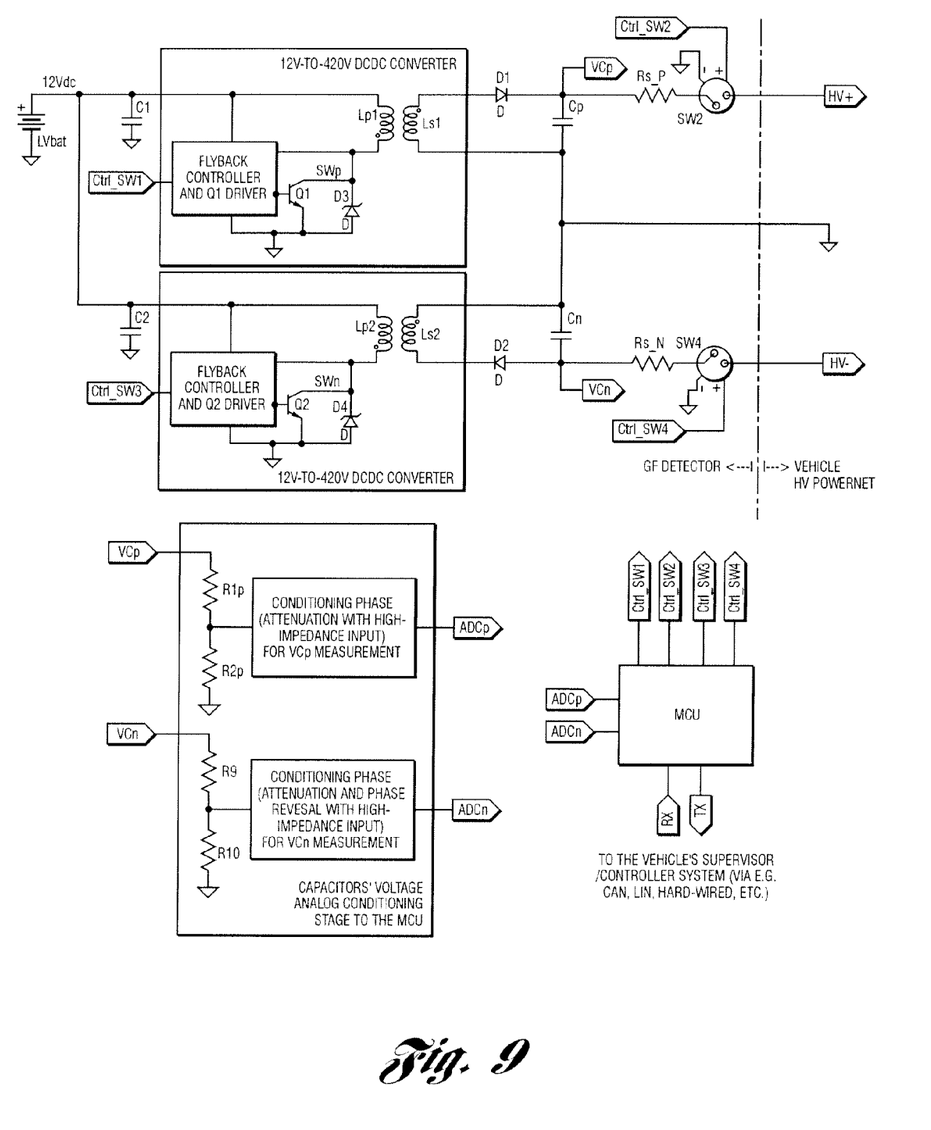
FIG. 9 schematically illustrates the ground-fault detection system in accordance with one non-limiting aspect of the present invention.

FIG. 9 shows the block diagram of a possible implementation of the described ground-fault detector. There, the output switches, the series discharge resistors and the Cp and Cn capacitor are depicted as in the basic circuit. The switches SW2 and SW4 2 may include small HV reed-relays that can be used to support the requirements of high cycling and HV switching with low currents.

The Vtest_P and Vtest_N voltage sources in FIG. 2 can be implemented via two small flyback DC/DC converters that generate the needed high voltage to charge the measurement capacitors when the microcontroller activates them thru the SW1 and SW2 control signals.

The VCp and VCn capacitor's voltages can be measured by the microcontroller's analog-to-digital converter after being properly conditioned by two filter stages, which can be used to provide the attenuation, with high-impedance input and low-pass filtering for both measured signals. For VCn, the input filter can add a phase reversal to properly accommodate this negative voltage at the input of the microcontroller's analog-to-digital converter.

According to one non-limiting aspect of the present invention, the ground-fault detector may be configured to support or perform some of all of the following basic functions:

To sample the VCp and VCn capacitor voltages to acquire their numeric value which are the inputs to Eq. 10 (i.e. VCp(t=tcp), and −VCn(t=tcn))

To control (ON/OFF) the four SW signals according to the timing shown in FIGS. 3a-3d To compute Eq. 10 and to evaluate the resulting VGFdet value against a stored-in-memory detection level. If VGFdet is lower or equal, then the vehicle power-net is regarded as improper (i.e. lacks of the proper isolation from ground). The reference detection level is also given by Eq. 10 when Rgnd_EQ=Rgnd_limit.

To communicate with the vehicle's supervisor and/or human-machine interface via a dedicated channel (e.g. CAN or LIN busses, hard-wired signals, LEDs or LCDs, etc) in order to report the detection of a ground fault and to get the needed operation input parameters (wake-up/sleep status, HV-battery voltage reported by the BMS—Battery Monitoring System-, etc).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of testing an electrical isolation between a high voltage (HV) network and a low voltage (LV) networks included within a vehicle system, wherein the LV network is electrically connected to the HV network with a HV positive wire and a HV negative wire, the method comprising:

determining the electrical isolation to be unacceptable in the event one of a voltage (Vcp) resulting from a discharge of a positive wire capacitor (Cp) to the HV positive wire is and a voltage (Vcp) resulting from discharge of a negative wire capacitor (Cn) to the HV negative wire is greater than a voltage threshold.

2. The method of claim 1 further comprising determining Vcp according to the following equation:

$$V_{Cp}(t=t_{cp}) \approx V_{test\_P} \cdot e^{-T/(C_p \cdot (R_{s\_p} + R_{gnd\_P}))}.$$

3. The method of claim 1 further comprising determining Vcn according to the following equation:

$$V_{Cn}(t = t_{cn}) \approx -V_{test\_N} \cdot e^{-T/(C_n \cdot (R_{s\_n} + R_{gnd\_N}))}.$$

4. The method of claim 1 further comprising determining the electrical isolation to be unacceptable in the event a voltage across the ground-fault detection unit (Vgfdet) greater that the threshold.

5. The method of claim 4 further comprising determining Vgfdet according to the following equation:

$$V_{GFDet}(R_{gnd\_EQ}) = V_{Cp}(t = t_{cp}) - V_{Cn}(t = t_{cn}) =$$
$$= \left[ \begin{array}{c} (V_{test\_P} - V_{p\_EQ}) \cdot \\ e^{-T/(C_p \cdot (R_{s\_p} + R_{gnd\_EQ}))} + V_{p\_EQ} \end{array} \right] - \left[ \begin{array}{c} (V_{test\_N} - V_{n\_EQ}) \cdot \\ e^{-T/(C_n \cdot (R_{s\_n} + R_{gnd\_EQ}))} + V_{n\_EQ} \end{array} \right].$$

6. The method of claim 1 further comprising determining the electrical isolation to be unacceptable if an equivalent resistance to ground of each of the HV_P and HV_N are below a limit value.

7. The method of claim 1 further comprising determining the desired voltage threshold for each of the Vcp and Vcn to corresponding with test voltages (Vtest_P and Vtest_N) that are used to charge Cp and Cn with energy provided from separate power sources included within the ground-fault detection unit.

8. The method of claim 7 further comprising controlling a number of switches included with the ground-fault detection unit in order to controlling charging and discharging of the Cp and Cn.

9. The method of claim 7 wherein Vtest_P and Vtest_N are greater than a voltage of the high voltage battery included in the HV network.

10. A system for testing an electrical isolation of separate high voltage (HV) and low voltage (LV) networks included within a vehicle system, where the LV network is referenced to the vehicle chassis and the HV network is referenced to a negative pole of a HV battery, the system comprising:

a ground-fault detection unit configured to determine the electrical isolation to be acceptable or unacceptable as a function of energy discharged separate capacitors (Cp and Cn) that respectively discharge to a HV positive wire (HV_P) of the HV network and a HV negative wire (HV_N) of the HV network.

11. The system of claim 10 wherein the ground-fault detection unit includes one or more switches to facilitate selectively discharging the capacitors to the HV_P and HV_N.

12. The system of claim 10 wherein the ground-fault detection unit identifies the electrical isolation of HV_N to be unacceptable if Cn is discharged above a predefined threshold and the electrical isolation of HV_P to be unacceptable if Cp is discharged above a predefined threshold.

13. The system of claim 10 wherein the ground-fault detection unit determines the electrical isolation to be unacceptable in the event a voltage across the ground-fault detection unit (Vgfdet) is greater than a threshold, wherein Vgfdet is determined according to the following equation:

$$V_{GFDet}(R_{gnd\_EQ}) = V_{Cp}(t = t_{cp}) - V_{Cn}(t = t_{cn}) =$$
$$= \left[ \begin{array}{c} (V_{test\_P} - V_{p\_EQ}) \cdot \\ e^{-T/(C_p \cdot (R_{s\_p} + R_{gnd\_EQ}))} + V_{p\_EQ} \end{array} \right] - \left[ \begin{array}{c} (V_{test\_N} - V_{n\_EQ}) \cdot \\ e^{-T/(C_n \cdot (R_{s\_n} + R_{gnd\_EQ}))} + V_{n\_EQ} \end{array} \right].$$

14. The system of claim 10 wherein the ground-fault detection unit identifies the electrical isolation to be acceptable or unacceptable as a function of the voltage across the Cp (Vcp) and Cn (Vcn).

15. The system of claim 14 wherein the ground-fault detection unit determines Vcp according to the following equation:

$$V_{Cp}(t = t_{cp}) \approx V_{test\_P} \cdot e^{-T/(C_p \cdot (R_{s\_p} + R_{gnd\_P}))}.$$

16. The system of claim 14 wherein the ground-fault detection unit determines Vcn according to the following equation:

$$V_{Cn}(t = t_{cn}) \approx -V_{test\_N} \cdot e^{-T/(C_n \cdot (R_{s\_n} + R_{gnd\_N}))}.$$

17. A ground fault detection unit operable within a vehicle to test electrical isolation of a high voltage network (HV) from a low voltage (LV) network, wherein the HV voltage network is connected to the LV voltage network through a positive wire and a negative wire and wherein the positive wire and negative wire respectively conduct current from a positive terminal of a high voltage battery and a negative terminal of the high voltage battery to the LV network, the ground fault detector unit comprising:

at least one switch operable in cooperation with a positive capacitor and a negative capacitor to respectively control discharge of the positive capacitor to the positive wire and the negative capacitor to the negative wire; and a controller operable to determine the electrical isolation between the HV network and the LV network to be acceptable in the event a positive capacitor voltage (Vcp) resulting from discharge of the positive capacitor and a negative capacitor voltage (Vnp) resulting from discharge of the negative capacitor is greater than a discharge threshold and to unacceptable in the event either on of the Vcp and Vnp are less that the discharger threshold.

18. The ground fault detection unit of claim 17 wherein the controller is operable to determine $$V_{Cp}(t = t_{cp}) \approx V_{test\_P} \cdot e^{-T/(C_p \cdot (R_{s\_p} + R_{gnd\_P}))}.$$

19. The ground fault detection unit of claim 17 wherein the controller is operable to determine $$V_{Cn}(t=t_{cn}) \approx -V_{test\_N} \cdot e^{-T/(C_n \cdot (R_{s\_n}+R_{gnd\_N}))}.$$

20. The ground fault detection unit of claim 17 wherein the controllers is operable to determine the electrical isolation between the HV network and the LV network to be unacceptable in the event a voltage across the ground fault detection unit (Vgfdet) resulting from discharge of the positive and negative capacitor is greater than a threshold wherein the Vgfdet is determined according to the following equation:

$$V_{GFDet}(R_{gnd\_EQ}) = \\ V_{Cp}(t=t_{cp}) - V_{Cn}(t=t_{cn}) = \left[(V_{test\_P} - V_{P\_EQ}) \cdot e^{-T/(C_p \cdot (R_{s\_P}+R_{gnd\_EQ}))} + V_{P\_EQ}\right] - \left[(V_{test\_N} - V_{n\_EQ}) \cdot e^{-T/(C_n \cdot (R_{s\_n}+R_{gnd\_EQ}))} + V_{n\_EQ}\right].$$

* * * * *